United States Patent [19]

Takahashi et al.

[11] Patent Number: 4,968,881
[45] Date of Patent: Nov. 6, 1990

[54] VOLTAGE DETECTOR USING ELECTRO-OPTIC MATERIAL HAVING ANTI-REFLECTIVE COATINGS

[75] Inventors: Hironori Takahashi; Shinichiro Aoshima; Yoshiharu Ooi; Mutsuji Takahashi; Yutaka Tsuchiya, all of Shizuoka, Japan

[73] Assignee: Hamamatsu Photonics Kabushiki Kaisha, Shizuoka, Japan

[21] Appl. No.: 305,346

[22] Filed: Feb. 2, 1989

[30] Foreign Application Priority Data

Apr. 8, 1988 [JP] Japan .................. 63-86470

[51] Int. Cl.$^5$ .............................. G01D 5/34
[52] U.S. Cl. ................. 250/231.10; 324/96; 350/164
[58] Field of Search ............... 250/231 R, 231.10; 324/96; 350/164, 311, 356, 374

[56] References Cited

U.S. PATENT DOCUMENTS

| | | | |
|---|---|---|---|
| 4,153,368 | 5/1979 | Falbel et al. | 356/225 |
| 4,336,982 | 6/1982 | Rector | 350/356 |
| 4,446,425 | 5/1984 | Valdmanis et al. | 324/77 K |
| 4,510,441 | 4/1985 | Yasuda et al. | 324/96 |
| 4,618,819 | 10/1986 | Mourou et al. | 324/77 K |
| 4,631,402 | 12/1986 | Nagatsuma et al. | 324/96 |
| 4,694,243 | 9/1987 | Miller | 350/374 |
| 4,749,255 | 6/1988 | Chakraparti et al. | 350/164 |
| 4,794,033 | 12/1988 | Ooi | 350/164 |
| 4,815,799 | 3/1989 | Goldstein | 350/356 |

FOREIGN PATENT DOCUMENTS 2040489  8/1980  United Kingdom.
2068137  8/1981  United Kingdom.
2125050  8/1984  United Kingdom.

OTHER PUBLICATIONS

Williamson, S. et al., "Picosecond Electro-Electron Optic Oscilloscope", Proc. Conf. Picosecond Electron, Optoelectron, Springer-Verlag, N. Y., pp. 58-61, 1985.
Valdmanis, J. A. et al., "Subpicosecond Electrooptic Sampling: Principles and Applications", IEEE Journal of Quantum Electronics, vol. QE-22, No. 1, pp. 69-78: Jan. 1986.
Macleod, H. A., "Antireflection Coatings", Thin-Film Optical Filters: Second Edition, Adam Hilger Ltd., Bristol, U.K., pp. 72-93, 1986.

*Primary Examiner*—David C. Nelms
*Assistant Examiner*—Stephone B. Allen
*Attorney, Agent, or Firm*—Finnegan, Henderson, Farabow, Garrett and Dunner

[57] ABSTRACT

A voltage detector comprises a light modulator which employs an electro-optic material whose refractive index changes according to the voltage developing in an object to be measured. A transparent anti-reflection film having a refractive index and thickness which are predetermined on the bases of a refractive index of the electro-optic material and a wavelength of incident light is formed on both light entrance and exit surfaces of the electro-optic material.

12 Claims, 3 Drawing Sheets

VOLTAGE DETECTOR USING ELECTRO-OPTIC MATERIAL HAVING ANTI-REFLECTIVE COATINGS

BACKGROUND OF THE INVENTION

The present invention relates to an apparatus for measuring the voltage developing in an object of interest by utilizing the change in the polarization state of light which occurs in response to the voltage-induced change in the refractive index of an electro-optic material.

FIG. 5 shows the basic composition of a presently available voltage detector.

The apparatus shown in FIG. 5 includes a light source 76, a light modulator 70 and a photodetector 71. The light modulator 70 includes a polarizer 72, an analyzer 74 and an electro-optic material 73 whose refractive index changes in accordance with the voltage developing in an object to be measured 75. When light from the light source 76 is launched into the light modulator 70, it is first linearly polarized by the polarizer 72 to produce incident light IL to be launched into the electro-optic material 73. The polarization state of the incident light IL changes in response to the change in the refractive index of the electro-optic material 73 which occurs in accordance with the voltage developing in the object to be measured 75. The resulting transmitted light TL is launched into the analyzer 74 which extracts from TL a polarized component that is perpendicular to the component extracted in the polarizer 72, thereby producing signal light SL. The intensity of signal light SL from the analyzer 74 changes in accordance with the voltage developing in the object 75 to be measured, so that said voltage can be measured by detecting the change in the intensity of SL by means of the photodetector 71.

It is a general fact that light falling at the boundary of two media having different indices of refraction or light emerging therefrom is partly reflected at that boundary, and this phenomenon is generally referred to as Fresnel reflection. Considering the boundary between air and a medium having a refractive index of $n_0$, the Fresnel reflectance R with respect to normal incidence light is expressed by:

$$R = [(n_0 - 1)/(n_0 + 1)]^2. \quad (1)$$

If the electro-optic material 73 is made of the crystal of $LiTaO_3$ having relatively large refractive index $n_0$ of 2.18, the equation (1) shows that as much as about 14% reflection occurs at the boundary between air and the $LiTaO_3$ crystal.

The result of Fresnel reflection occurring in the electro-optic material 73 is shown in FIG. 6. The incident light IL launched into the electro-optic material 73 is reflected both by the incident and exit surfaces of the material 73 to produce transmitted light $T_1$ which accounts for about 74% of incident light IL. Considering the transmitted light $T_2$ which is produced as a result of multiple reflection within the electro-optic material 73, the overall proportion of the incident light IL present in the transmitted light TL is about 75.4%. As a result, even if the voltage developing in the object to be measured is at such a value that the signal light SL has a maximum intensity, its maximum intensity $S_{max}$ is significantly lowered compared with the case where zero Fresnel reflection is assumed (namely, 100% of the incident light IL is transmitted). It should be mentioned here that such a drop in the maximum intensity of SL is further increased by the Fresnel reflection that occurs in optical systems other than the electro-optic material 73 such as the polarizer 72 and the analyzer 74.

It should also be mentioned that the transmitted light $T_1$ which has not experienced multiple reflection and the transmitted light $T_2$ which is produced after multiple reflection have traveled through the electro-optic material 73 over different lengths of optical path. As a result, $T_2$ differs from $T_1$ in the state of polarization, making it impossible to reduce the minimum intensity $S_{min}$ of signal light SL to the ideal value, namely "0". The intensity of signal light SL assumes a minimum value $S_{min}$ when the voltage to be measured is such that the polarization state of transmitted light $T_1$ prevents itself from being transmitted through the analyzer 74. However, even at such a voltage, part of the transmitted light $T_2$ (whose intensity is about 1.8% of that of $T_1$ for the case where the electro-optic material 73 is made of a $LiTaO_3$ crystal) travels through the analyzer 74 and the minimum intensity $S_{min}$ of SL generally assumes a finite value which is not "0". Such a decrease in the maximum intensity $S_{max}$ signal light and an increase in its minimum intensity $S_{min}$, both being due to Fresnel reflection, have caused a reduction in the extinction ratio (i.e. $S_{max}/S_{min}$) of signal light SL to a relatively low value of about 100. When the extinction ratio of the signal light SL drops, the dynamic range of voltage measurements which rely upon the detection of the intensity of signal light SL from the light modulator 70 by means of the light detector 71 is inevitably reduced because of the inability to attain a high modulation factor by means of lowering the optical bias point of the light modulator 70.

Another problem associated with the prior art is that the transmitted light $T_2$ whose polarization state differs from that of $T_1$ is contained in the signal light SL, so that the precision of measurement is reduced.

In order to compensate for the spontaneous birefringence that occurs within the electro-optic material 73, systems have been proposed that further include a Babinet compensator or a compensating electro-optic material that is as thick as the electro-optic material 73 and whose optic axis is inclined by 90 degrees with respect to that of the electro-optic material 73. But the above-described problems in association with Fresnel reflection have also occurred in such systems.

SUMMARY OF THE INVENTION

An object, therefore, of the present invention is to provide a voltage detector which is capable of increasing a dynamic range and precision of voltage measurement by effectively preventing the reflection of light from occurring at the entrance and exit surfaces of an optical system such as an electro-optic material.

This object of the present invention can be achieved by a voltage detector having an optical system which employs an electro-optic material whose refractive index changes according to the voltage developing in an object to be measured, wherein a transparent anti-reflection film having a refractive index and thickness that are predetermined on the basis of the refractive index of said optical system and the wavelength of light is formed on both the light entrance and exit surfaces of said optical system. The anti-reflection film to be formed may be of a single-layer structure that is adapted for light having a specified wavelength or a multi-layer structure adapted for light having a predetermined wavelength range.

The voltage detector of the present invention has the transparent anti-reflection film formed on both the light entrance and exit surfaces of the optical system, say, the electro-optic material. If this anti-reflection film is made of a material having a refractive index and a thickness that are predetermined on the basis of the refractive index of the electro-optic material and the wavelength of light, reflection of light that would otherwise occur on the entrance and exit surfaces of the electro-optic material can be prevented, thereby reducing not only the loss of transmitted light that will emerge from the electro-optic material but also the intensity of the transmitted light that would be produced by multiple reflection. In order to extend the dynamic range of voltage measurements with a voltage detector, the extinction ratio, that is, the ratio of maximum intensity $S_{max}$ to minimum intensity $S_{min}$ of the signal light that is obtained by extracting a predetermined polarization component from the transmitted light that has undergone a voltage-induced change in its state of polarization must be increased. As already mentioned, the transmitted light which is produced after multiple reflection has traveled through the electro-optic material over a longer optical path and hence has experienced a different change in the polarization state than the transmitted light that has not experienced multiple reflection. The presence of the first type of transmitted light increases the minimum intensity $S_{min}$ of signal light and hence is undesirable for the purpose of increasing the extinction ratio of the signal light. In the present invention, the transmitted light which is produced after multiple reflection is reduced SO as to decrease the minimum intensity $S_{min}$ of signal light. At the same time, the loss of transmitted light emerging from the electro-optic material is reduced so as to increase the maximum intensity $S_{max}$ of signal light. The overall effect of these phenomena is an improvement in the extinction ratio of signal light.

In accordance with the present invention, the precision of voltage measurements can also be improved by reducing the transmitted light that is created by multiple reflection and has a different change in its state of polarization. If the anti-reflection film is of a single-layer structure, reflection of light having a specified wavelength can be prevented in a very efficient manner. If the anti-reflection film is of a multi-layer structure, enhanced anti-reflection effects are assured against light having a predetermined wavelength range.

DETAILED DESCRIPTION OF THE PREFERRED EMBODIMENTS

Two typical embodiments of the present invention are described hereinafter with reference to the accompanying drawings.

Figure 1:
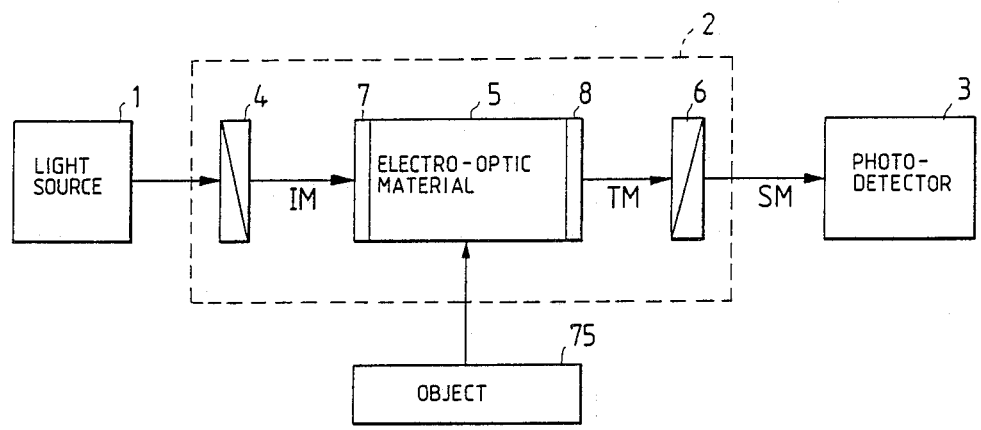
FIG. 1 is a schematic representation of the composition of a voltage detector according to the first embodiment of the present invention.

FIG. 1 is a schematic representation of the composition of a voltage detector according to the first embodiment of the present invention. As shown, the apparatus consists essentially of a light source 1, a light modulator 2 and a photodetector 3. The light source 1 may be a He-Ne laser emitting a laser beam with a wavelength of 633 nm. The photodetector 3 may be in the form of a high-speed photodetector (e.g. streak camera or sampling optical oscilloscope) or a photoelectric converter. The light modulator 2 includes a polarizer 4, an analyzer 6, and an electro-optic material 5 whose refractive index changes in accordance with the voltage developing in an object to be measured 75. The two boundaries of the electro-optic material 5, namely, its light entrance and exit surfaces, are provided with anti-reflection films 7 and 8.

The electro-optic material 5 is made of a nonlinear optical medium which generally has electro-optic effects, and is selected from among the crystals of LiTaO₃ and LiNbO₃ having the Pockels effect and a Kerr cell in which $CS_2$ having the Kerr effect is contained in a transparent cell.

The polarizer 4 and the analyzer 6 are typically composed of a Glan-Thompson prism or Glan-Taylor prism. Alternatively, they may be composed of an optical fiber type polarizer, and this offers the advantages that they hardly receive any adverse effects from an ambient environment and the light intensity loss is lowered.

In the first embodiment shown in FIG. 1, the anti-reflection films 7 and 8 are of a single-layer structure. In order to eliminate the Fresnel reflection of incident light IM having a single wavelength λ that might occur at an entrance or exit surface of the electro-optic material 5, these anti-reflection films are formed of a material that satisfies the following conditions with respect to its refractive index n and film thickness d:

$$n = \sqrt{n_0 n_s} \qquad (2)$$

$$nd = \lambda/4$$

wherein $n_0$ signifies the refractive index of the electro-optic material 5 and $n_s$ denotes the refractive index of air which is 1.0. Therefore, if the electro-optic material 5 is made of the crystal of LiTaO₃ or LiNbO₃ which has the refractive index ($n_0$) of about 2.2 and if the incident light IM is light with wavelength λ of about 633 nm emitted from a He-Ne laser, it is necessary that the anti-reflection films 7 and 8 be made of SiO₂ (n=1.46), ThF₄ (n=1.50), Si₂O₃ (n=1.52), BaF₂ (n=1.40) or other material, that is transparent and has the refractive index (n) of about 1.48. It is also necessary that these anti-reflection films have the thickness (d) of about 108 nm.

In the composition described above, the light from the light source 1 which has the single wavelength of λ is linearly polarized with the polarizer 4 to produce incident light IM which is launched into the electro-optic material 5 having the anti-reflection films 7 and 8 formed on its entrance and exit surfaces, respectively. The incident light IM launched into the electro-optic material 5 experiences a change in its state of polarization according to the voltage developing in the object to be measured 75, thereby producing transmitted light TM which issues from the electro-optic material 5 and enters the analyzer 6. In the analyzer 6, a predetermined component of polarization is extracted from the light TM to produce signal light SM, the intensity of which is detected with the photodetector 3. The change in the intensity of signal light SM is a measure of the change in the voltage developing in the object to be measured 75, so that the photodetector 3 is capable of measuring the voltage of interest in terms of the intensity of signal light SM.

Figure 2:
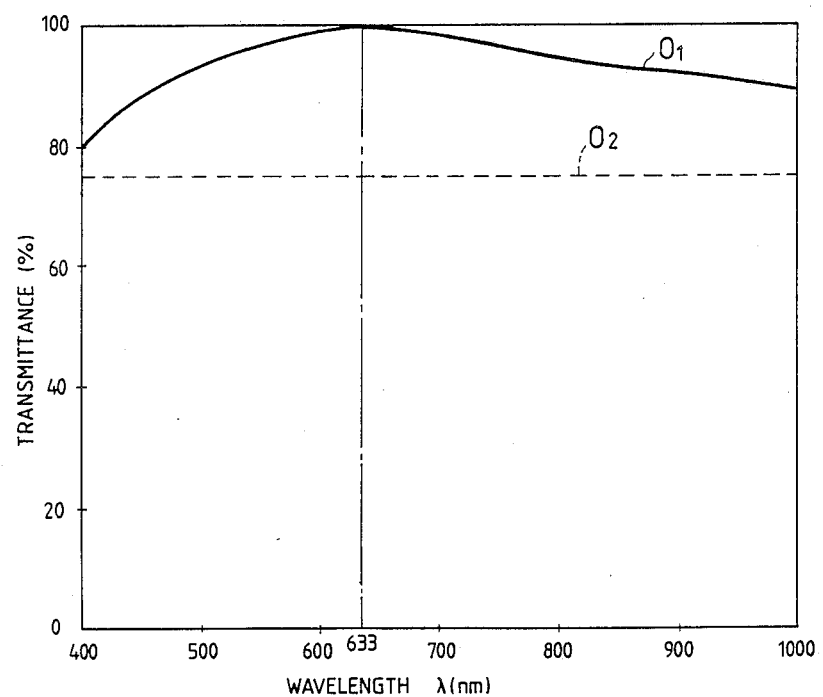
FIG. 2 is a graph showing the results of measurements of spectral transmittance on the apparatus shown in FIG. 1.

When measurements of spectral transmittance were conducted with a system that employed the crystal of $LiTaO_3$ as an electro-optic material 5 and in which single-layered anti-reflection films 7 and 8 were formed of $SiO_2$ (n=1.46) in the thickness of 108 nm on the optically polished light entrance and exit surfaces of the crystal by means of a vacuum deposition apparatus, the results were as shown in FIG. 2 by $O_1$. For comparison, spectral transmittance measurements were also conducted in the absence of the anti-reflection films 7 and 8 and the results are shown in FIG. 2 by $O_2$.

As is clear from FIG. 2, the anti-reflection films 7 and 8 effectively reduce the Fresnel reflection and, in particular, with the incident light IM having a wavelength λ of 633 nm, 99% of the incident light launched into the electro-optic material 5 is picked up as the transmitted light TM, thereby increasing the maximum intensity $S_{max}$ of signal light SM. As a further advantage, the proportion of the transmitted light TM that is produced by multiple reflection is so small that the polarization state of TM is substantially uniform and brings the minimum intensity $S_{min}$ of signal light close to zero. When a voltage was actually applied to the electro-optic material 5, the extinction ratio ($S_{max}/S_{min}$) of signal light SM was found to be about 3,000, which is about 30 times as high as the value so far attainable with the prior art system.

It can be understood that when measuring the voltage developing in the object 75 with weak signal light SM whose intensity is in the vicinity of the minimum intensity $S_{min}$, intensity variation of the signal light SM becomes extremely small. As a result, if the minimum intensity $S_{min}$ is not sufficiently small, the intensity variation of the signal light SM is buried in the signal light (minimum intensity $S_{min}$) and hence cannot be separately detected. By contrast, where the minimum intensity $S_{min}$ is made close to zero by employing the anti-reflection films 7 and 8 according to the invention, the intensity variation of the signal light SM due to the voltage in the object 75 is larger than the minimum intensity $S_{min}$ and hence can be detected. This means an improvement of the dynamic range of voltage detection in the voltage detector.

Since the transmitted light TM is substantially uniform in the state of polarization, the system of the present invention offers the additional advantage of a marked improvement in the precision of voltage measurements.

In the embodiment described above, the light source 1 is a He-Ne laser that emits light having the wavelength λ of 633 nm. If lasers that output other wavelengths of light are to be employed, the same results can be attained by modifying the thickness (d) of the anti-reflection films 7 and 8 in such a way that conditions (2) are satisfied.

Figure 3:
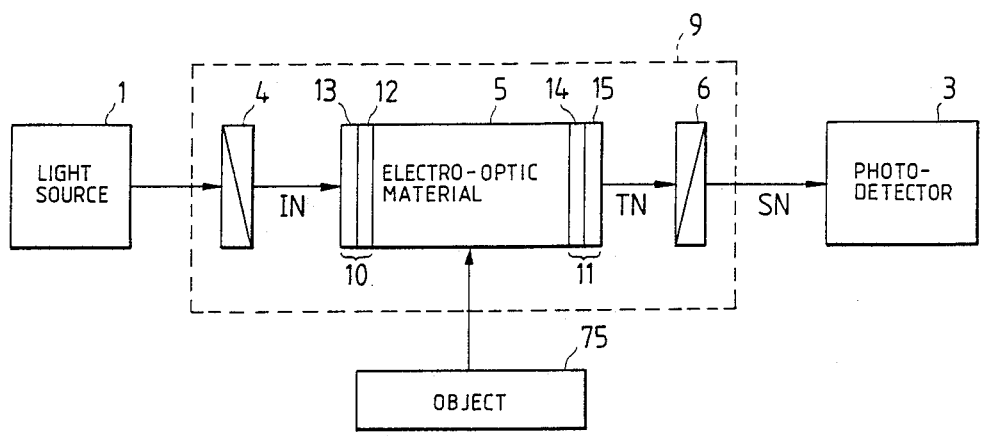
FIG. 3 is a schematic representation of the composition of a voltage detector according to the second embodiment of the present invention.

FIG. 3 is a schematic representation of the composition of a voltage detector according to the second embodiment of the present invention. In this second embodiment, multi-layered anti-reflection films are employed and FIG. 3 shows the case where two-layered films are used. Stated more specifically, two-layered anti-reflection films 10 and 11 are formed on the respective light entrance and exit surfaces of the electro-optic material 5 in the light modulator 9. The anti-reflection film 10 consists of the first layer 12 and the second layer 13. In a similar way, the anti-reflection film 11 is composed of the first layer 14 and the second layer 15. As for FIG. 3, the components which are the same as those shown in FIG. 1 are identified by like numerals and will not be described in detail.

In the second embodiment having the composition described above, each of the anti-reflection films 10 and 11 is made of a multi-layered structure and this is effective in preventing the reflection of incident light having a broad range of wavelength.

Figure 4:
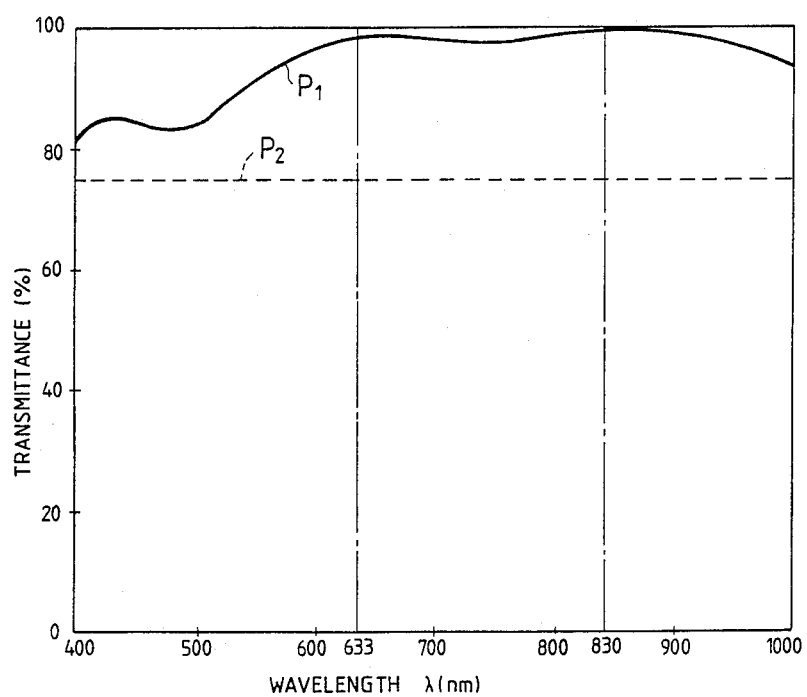
FIG. 4 is a graph showing the results of measurements of spectral transmittance on the apparatus shown in FIG. 3.
Figure 5:
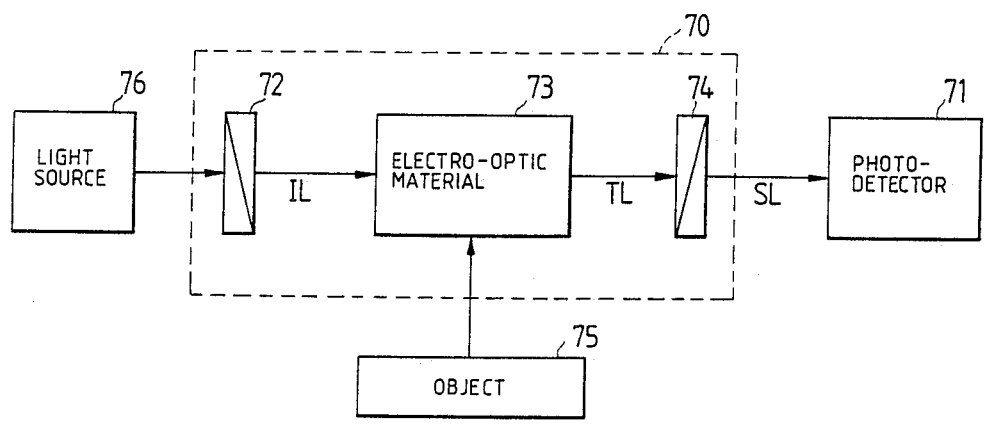
FIG. 5 is a schematic representation of the composition of a prior art voltage detector.
Figure 6:
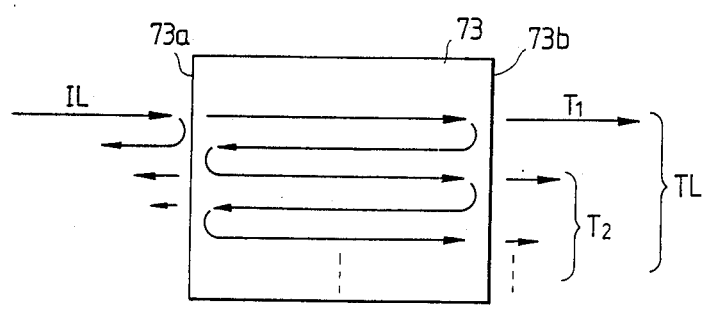
FIG. 6 illustrates how incident light is transmitted through or reflected by entrance and exit surfaces of an electro-optic material used in the voltage detector shown in FIG. 5.

When measurements of spectral transmittance were conducted with a system that employed the crystal of $LiTaO_3$ as the electro-optic material 5 and in which the first layers 12 and 14 of anti-reflection films 10 and 11 were formed of $ZrO_2$ (n=2.00) in a thickness of 269 nm on the respective optically polished light entrance and exit surfaces of the crystal by means of a vacuum deposition apparatus and the second layers 13 and 15 of the anti-reflection films were formed of $SiO_2$ (n=1.46) in a thickness of 123 nm, the results were as shown in FIG. 4 by $P_1$. For comparison, spectral transmittance measurements were also conducted in the absence of the anti-reflection films 10 and 11 and the results are shown in FIG. 4 by $P_2$. As one can see from FIG. 4, the two-layered structure of anti-reflection films enabled at least 96% of the incident light IN having a broad range of wavelength from 580 nm to 950 nm to be picked up as the transmitted light TN. As a further advantage, the proportion of the transmitted light TN that is produced by multiple reflection is so small over this broad range of wavelength that the polarization state of TN is substantially uniform and brings the minimum intensity $S_{min}$ of signal light SN close to zero. When a voltage was actually applied to the electro-optic material 5, the extinction ratio ($S_{max}/S_{min}$) of signal light SN was found to be at least 1,000 whether the light source 1 was a He-Ne laser operating at wavelength λ of 633 nm or a semiconductor laser operating at a wavelength λ of 830 nm. Therefore, the system according to the second embodiment of the present invention is capable of attaining the extinction ratio of at least 10 times as high as the value so far attainable with the prior art system. Since the transmitted light TN is substantially uniform in its polarization state, the system of the present invention offers that additional advantage of a marked improvement in the precision of voltage measurements.

In the second embodiment described above, anti-reflection is achieved over the wavelength range of from 580 nm to 950 nm. If one wants to modify the breadth of this effective wavelength range, he only needs to change the overall thickness of each anti-reflection film with the proportions of the individual constituent layers in thickness being held constant. In this case, too, the desired anti-reflection effects are obtained. In the second embodiment, the first layers 12 and 14 are made of $ZrO_2$ whereas the second layers 13 and 15 are formed of $SiO_2$. Other materials may of course be employed so long as they are transparent and have about the same refractive index. Needless to say, anti-reflection films that are capable of preventing light reflection over a broader range of wavelengths can be formed by composing each film of more than two layers.

The light source 1 which is employed in the first and second embodiments to emit light for voltage measurements may be of a type that outputs CW (Continuous Wave) light or of a type that outputs light of short pulses. When the CW light source which outputs CW light to be used, a high-speed photodetector such as a streak camera or a sampling optical oscilloscope is preferably employed as the photodetector 3. If the light source that outputs light of short pulses is to be used, a photoelectric converter is preferably employed as the photodetector 3. The use of these photodetectors enables a rapidly changing voltage in the object of interest to be sampled and measured with an extremely high time resolution.

For the purpose of preventing the spontaneous birefringence that would otherwise occur in the electro-optic material 5, a Babinet compensator or a compensating electro-optic material that is as thick as the electro-optic material 5 and whose optic axis is inclined by 90 degrees with respect to the optic axis of the material 5 may be added to the embodiments described above. In this case, too, the improved extinction ratio and higher precision of voltage measurements can be attained by forming the anti-reflection films on the light entrance and exit surfaces of these compensating devices in the manner described above.

In the embodiments described above, the anti-reflection films are formed only on the light entrance and exit surfaces of the electro-optic material 5. If desired, such anti-reflection films may be formed on other optical systems including the polarizer 4 and the analyzer 6. This is effective in further enhancing the anti-reflection effects that can be attained, thereby achieving further improvements in the extinction ratio and the precision of voltage measurements.

As described on the foregoing pages, the voltage detector of the present invention has the optical system that employs the electro-optic material whose refractive index changes according to the voltage developing in an object to be measured, and the transparent anti-reflection film having the refractive index and the thickness that are predetermined on the basis of the refractive index of the optical system and the wavelength of light is formed on both the light entrance and exit surfaces of said optical system. The anti-reflection layers are capable of effectively preventing the reflection of light that would otherwise occur at the entrance and exit surfaces of the optical system, thereby improving the extinction ratio of signal light, which contributes to a broader dynamic range and higher precision of voltage measurements. If the anti-reflection films are single-layered, they are capable of providing enhanced anti-reflection effects against light having a specified single wavelength. If they are multi-layered, enhanced anti-reflection effects are assured against light in a predetermined range of wavelength.

What is claimed is:

1. A voltage detector for detecting a voltage in an object, comprising:

a pulsed light source for emitting incident light pulses;

a light modulator for modulating intensity of said light pulses including an electro-optic material having an entrance surface and an exit surface, a refractive index of said electro-optic material being changed in accordance with said voltage of said object, and on both said entrance surface and said exit surface of said electro-optic material being formed a transparent anti-reflection film with a prescribed refractive index and thickness; and a photodetector for detecting modulated light pulses and for determining said voltage of said object on the basis of intensity of said modulated light pulses.

2. A voltage detector as claimed in claim 1, wherein said anti-reflection film has a single-layer structure which is adapted for light pulses having a specified wavelength.

3. A voltage detector as claimed in claim 1, wherein said anti-reflection film has a multi-layer structure which is adapted for a light beam having a prescribed range of wavelengths.

4. A voltage detector as claimed in claim 1, said light modulator further comprises:

a polarizer for extracting light pulses with a first predetermined polarization component from said incident light pulses; and an analyzer for extracting light pulses with a second predetermined polarization component from said light pulses outputted from said electro-optic material to produce said modulated light pulses.

5. A voltage detector as claimed in claim 4, wherein a transparent anti-reflection film with a prescribed refractive index and thickness is formed on both an entrance surface and an exit surface of said analyzer and said polarizer.

6. A voltage detector for detecting a voltage in an object, comprising:

a continuous wave light source for emitting a continuous incident light beam;

a light modulator for modulating intensity of said continuous light beam including an electro-optic material, said electro-optic material having an entrance surface and an exit surface, a refractive index of said electro-optic material being changed in accordance with said voltage to said object, and a transparent anti-reflection film with a prescribed refractive index and thickness being formed on both said entrance surface and said exit surface of said electro-optic material; and a photodetector for detecting a modulated light beam and for determining said voltage of said object on the basis of intensity of said modulated light beam, said photodetector including a high speed photodetector for detecting said modulated light beam at a high speed and displaying the change of said voltage as a function of time.

7. A voltage detector as claimed in claim 6, wherein said anti-reflection film has a single-layer structure which is adapted for a continuous light beam having a specific wavelength.

8. A voltage detector as claimed in claim 6, wherein said anti-reflection film has a multi-layer structure which is adapted for a continuous light beam having a prescribed range of wavelengths.

9. A voltage detector as claimed in claim 6, wherein said high speed photodetector includes a streak camera.

10. A voltage detector as claimed in claim 6, wherein said high speed voltage detector includes a sampling optical oscilloscope.

11. A voltage detector as claimed in claim 6, said light modulator further including:
 a polarizer for extracting a continuous light beam with a first predetermined polarization component from said incident light beam; and
 an analyzer for extracting a continuous light beam with a second predetermined polarization component from a light beam outputted from said electro-optical material to produce said modulated light beam.

12. A voltage detector as claimed in claim 11, wherein a transparent anti-reflection film with a prescribed refractive index and thickness is formed on both an entrance surface and an exit surface of both said analyzer and said polarizer.

* * * * *